United States Patent [19]

Donovan, III et al.

[11] 4,325,991

[45] Apr. 20, 1982

[54] ELECTROLESS PLATING OF POLYESTERS

[75] Inventors: Lawrence P. Donovan, III, Monrovia; Eileen Maguire, Arcadia; David A. Dillard, Diamond Bar, all of Calif.

[73] Assignee: Crown City Plating Co., El Monte, Calif.

[21] Appl. No.: 222,592

[22] Filed: Jan. 5, 1981

[51] Int. Cl.³ .......................... C23C 3/02; B29C 17/08
[52] U.S. Cl. .................................... 427/307; 156/668; 427/306
[58] Field of Search ................. 427/306, 307; 156/668

[56] References Cited

U.S. PATENT DOCUMENTS

| | | | |
|---|---|---|---|
| 3,142,582 | 7/1964 | Koretzky et al. | 156/668 |
| 3,394,023 | 7/1968 | Wilhelm et al. | 427/306 |
| 3,442,683 | 5/1969 | Lenoble et al. | 427/306 |
| 3,567,594 | 3/1971 | Wells | 427/307 |
| 4,125,649 | 11/1978 | Donovan et al. | 156/668 |

FOREIGN PATENT DOCUMENTS

| | | | |
|---|---|---|---|
| 49-17856 | 2/1974 | Japan | 427/306 |
| 52-60869 | 5/1977 | Japan | 427/306 |
| 54-15977 | 2/1979 | Japan | 427/306 |
| 55-99929 | 7/1980 | Japan | 427/307 |
| 2040969 | 9/1980 | United Kingdom | 427/307 |
| 2040970 | 9/1980 | United Kingdom | 427/307 |

*Primary Examiner*—John D. Smith
*Attorney, Agent, or Firm*—Christie, Parker & Hale

[57] ABSTRACT

Filled polyester substrates are conditioned for electroless plating by contact with an alkaline conditioner having a pH of at least 8, followed by contact with an aqueous acid fluoride etch solution having a pH less than about 5 and a fluoride concentration of at least 1 mole per liter of solution.

48 Claims, No Drawings

ELECTROLESS PLATING OF POLYESTERS

BACKGROUND OF THE INVENTION

The present invention relates to electroless plating of polyesters, in particular, to providing a surface uniformly receptive to metals which catalyze electroless deposition of nickel and copper.

The benefits of electroless plated, non-conductive articles, particularly plastic articles, are well known. In the finished product, the desirable characteristics of the plastic and the metal are combined to offer thereby the technical and aesthetic advantages of each.

Polymeric substrates are conventionally plated by preconditioning the surface by contact with an aqueous solution of at least one organic compound active for "conditioning" or "pre-etching" the surface of the plastic, etching with a strong oxidizing acid or base, seeding the surface with a noble metal catalyst, e.g., a palladium chloride solution, then immersing the seeded surface in an autocatalytic electroless plating solution where an initial coating of a conductive metal, e.g., copper or nickel, is established by chemical deposition. The metal deposit acts as a buss to allow a thicker coating of metal to be built up electrolytically.

In U.S. Pat. No. 3,567,594 there is disclosed a process of electroless plating which involves incorporating a siliceous filler into a plastic; molding the resulting plastic; conditioning the molded plastic product by treating the plastic product, in series, with an acid chromate etch followed by an HF treatment; preplating the conditioned article with an electrolessly plateable metal and electroplating the preplated article. The process was demonstrated using certain ethylene propylene copolymers and polypropylene. The process was represented as utile for polyesters. We evaluated the process on a "plateable" grade of a propylene polymer manufactured and sold by the assignee of the '594 patent, and found the treating procedures to be functional. When, however, applied to a mineral-filled polyester known as Valox TM 745, manufactured and sold by General Electric Company, the procedure failed.

SUMMARY OF THE INVENTION

It has now been found that electroless plating of filled polyesters can be enhanced by first contacting the filled polyester substrate with an alkaline conditioner having a pH of at least about 8, preferably an aqueous solution of at least one alkali metal hydroxide in which the alkali metal hydroxide content is from about 2 percent by weight to solution saturation, more preferably from about 10 to about 50 percent by weight, still more preferably from about 25 to about 35 percent by weight. The alkaline conditioner is maintained at a temperature of from about 135° F. to the lesser of the boiling point of the solution and the softening point of the polyester substrate, preferably from about 145° F. to about 175° F. The alkaline conditioner serves as an initial etchant. Contact is for a time sufficient to enable etching in an aqueous acid fluoride etch solution and may range from 0.5 minute or less to 20 minutes or more, preferably from about 3 to about 8 minutes.

The substrate is then contacted with an aqueous acid fluoride etch solution having a pH less than about 5 and having an effective fluoride concentration of at least about 1 mole per liter of solution to solution saturation as provided by at least one fluoride compound. Etch is at a temperature from ambient to the lower of the solution boiling point and softening temperature of the substrate. The preferred range is from about 125° F. to about 150° F. The concentration of the fluoride is sufficient to etch the filled polyester surface and render it uniformly receptive to seeding by a metal catalyst and provide, when plated, a higher bond strength than is available by the use of an alkaline conditioning solution alone. Although a solution of hydrofluoric acid may be employed, it is preferred to employ a solution of another fluoride compound, preferably a fluoride salt in combination with hydrofluoric and/or a mineral acid. The presently preferred solutions are solutions containing the salt ammonium bifluoride in a concentration of at least about 3 percent by weight of solution, preferably promoted with sulfuric acid. The presently preferred acid fluoride etch solution contains from about 20 to about 40 percent by weight ammonium bifluoride and from about 5 to about 15 percent by weight sulfuric acid. The most preferred acid fluoride etch solution is one containing about 25 to 35 percent by weight ammonium bifluoride and about 8 to about 10 percent by weight sulfuric acid. Contact time may range from about 1 to about 20 minutes, preferably from about 3 to about 10 minutes.

To enhance surface appearance and eliminate bright spots, it is preferred to precede contact with the aqueous alkaline conditioning solution with a detergent rinse followed by pre-conditioning with a hydrolizer solution, which functions as described in U.S. Pat. No. 3,689,303, to render the surface hydrophilic.

Contact with the aqueous acid fluoride etch solution is followed by seeding the surface with a metal electroless plating catalyst which is a solution of metal ions or a suspension of metal particles.

Following seeding and activation of the metal catalyst by conventional means, the surface can be uniformly plated with electroless copper or nickel followed by electroplating in a conventional manner.

In the practice of the invention, the aqueous acid fluoride etch solution is non-functional in the absence of conditioning with the aqueous alkaline conditioning solution. More significantly and synergistically, a mineral acid, such as sulfuric acid, which is non-functional in itself when combined with a fluoride salt, such as ammonium bifluoride, provides a doubling of adhesion of the deposited metal plate as compared to the use of ammonium bifluoride in the absence of the mineral acid.

DETAILED DESCRIPTION

According to the present invention, there is provided a process which enables uniform electrodeposition of metals onto polyester substrates. In particular, the process of the present invention is directed to electroless plating of filled polyesters which, as used herein, means polyesters containing at least about 10 percent by weight filler, in the form of mineral, glass and silica fillers, and mixtures thereof. The process is particularly adaptive to electroless plating of articles molded of thermoplastic polyester resins, preferably thermoplastic polybutylene terephthalate resins.

The process of the invention comprises, broadly, conditioning the filled polyester substrate by contact with an alkaline conditioner having a pH of at least about 8 and maintained at a temperature of about 135° F. to the lesser of the boiling point of the conditioner and the softening point of the substrate, for a time sufficient to enable etch of the polyester substrate with an aqueous acid fluoride etch. Contact time may range from about 0.5 minute or less to 20 minutes or more, preferably about 3 to about 8 minutes. This is followed by contact of the conditioned filled polyester substrate with an aqueous acid fluoride etch solution having a pH of 5 or less and effective fluoride content of from about 1 mole per liter of solution to solution saturation at the temperature employed, as provided by at least one soluble fluoride compound. Contact is for a time sufficient to etch the surface and increase the bond strength of a deposited metal to the polyester substrate. Contact time is preferably from about 1 to about 20 minutes, more preferably from about 3 to about 8 minutes. In general, short contact time gives the best appearance and lowest adhesions, whereas long contact times increase adhesion to the detriment of appearance.

In the process of the invention, the alkaline conditioner serves an etch function to a limited degree, but is insufficient for industrial application. The aqueous acid fluoride etch solution is not in itself functional without use in combination with the aqueous alkaline conditioner.

Although an optional step, the preferred first step in the practice of the invention is to cleanse and render the surface of the polyester substrate hydrophilic. This prevents air bubbles from accumulating at the substrate surface during immersion in the alkaline conditioner and eliminates "bright spots" on the deposited plate. It is preferred to thoroughy clean the filled polyester substrate by first contacting the substrate with a detergent solution. The presently preferred detergent solution is an aqueous solution containing from about 0.5 to about 1 percent by weight of a nonionic detergent, preferably an ethylene oxide condensate. Typical immersion time is about 1 minute. This is followed by contact with a hydrolizer solution described in detail in U.S. Pat. No. 3,689,303, incorporated herein by reference. The hydrolizer solution serves to further clean the polyester substrate and render the surface hydrophilic. The presently preferred hydrolizer solution is an aqueous solution containing 100 grams/liter of chromic acid in 400 mls/liter of sulfuric acid. Contact time is not narrowly critical, but typically contact times in the order of 2 to 3 minutes at temperatures from 100° F. to 160° F. or more are employed.

After cleansing, the filled polyester substrate is conditioned in an alkaline conditioner prior to etch in the aqueous acid fluoride etch solution. The alkaline conditioners useful in the practice of the instant invention have a pH of at least about 8 and are preferably aqueous solutions of at least one alkali metal hydroxide in which the alkali metal hydroxide content is from about 2 percent by weight to solution saturation, more preferably from about 10 to about 50 percent by weight, still more preferably from about 25 to about 35 percent by weight alkali metal hydroxide. Although solutions of alkali metal hydroxide, particularly sodium hydroxide, are preferably used as the alkaline conditioner, other alkaline compounds, such as sodium metasilicate, trisodium phosphate, sodium carbonate, polyalkyl polyamines, such as triethylene tetramines, alone or in admixture with an alkali metal hydroxide, and if liquid, neat or diluted with water. It is preferred that the conditioner be maintained at a temperature from about 145° F. to about 175° F.

After conditioning in the alkaline conditioner, the polyester substrate to be electrolessly plated is rinsed and passed to the aqueous acid fluoride etch solution, which is a solution maintained at a pH of 5 or less and provides dissolved fluoride (F) to a level of at least 1 mole per liter of solution to solution saturation. Contact is for a time sufficient to increase the bond of the electrolessly deposited plate over that achieved with the alkaline conditioner and may range from about 1 to about 20 minutes, preferably from about 3 to about 8 minutes.

A variety of soluble fluoride compounds may be employed in the makeup of the acid fluoride etch. Although acids such as hydrofluoric acid, fluorosulfonic acid and fluoroboric acid and the like may be used, it is preferred to employ another fluoride compound used alone or in combination with hydrofluoric or a mineral acid, such as hydrochloric, sulfuric and nitric acid. Compounds which may be employed are those compounds capable of liberating fluoride ions in an acid medium, such as sodium bifluoride, ammonium bifluoride, sodium fluoride, potassium fluoride, lithium fluoride and the like. The presently preferred aqueous acid fluoride solutions are solutions based on salts of a weak acid and a base, particularly ammonium bifluoride, used alone or in combination with a mineral acid. The latter is preferred as providing the highest bond strengths. The ammonium bifluoride is provided in a concentration of at least about 3 percent by weight of solution. Without being bound by theory, it appears that the ammonium bifluoride serves as a reservoir for active fluoride ions and provides more fluoride ions to solution as it is consumed. The mineral acid, particularly sulfuric acid, appears to enhance the activity of the fluoride in providing bond strengths generally twice that achieved in the absence of the mineral acid, whic is not per se functional.

As indicated, the presently preferred solutions are solutions of ammonium bifluoride, present in a concentration of about 20 to about 40 percent by weight, more preferably about 25 to about 35 percent by weight, alone or in combination with a mineral acid, preferably sulfuric acid, present in a concentration of about 5 to about 15 percent by weight, preferably from about 8 to about 10 percent by weight of solution. Although not required, a buffering agent, as well as other salts such as ammonium sulfate, may be present. Etch temperature will range from ambient to the lesser of the boiling point of the solution or softening temperature of the resin, preferably in the range from about 125° F. to about 150° F. Contact time will range generally from about 1 to about 20 minutes, preferably from about 3 to about 8 minutes.

In connection with an aqueous acid fluoride etch solution based on the use of ammonium bifluoride alone or in combination with sulfuric acid, it has been observed that the degree of adhesion achieved will be substantially independent of concentration of the ammonium bifluoride within the ranges prescribed above, and adhesion of a plate to the surface of the substrate will increase with contact time, with optimization achieved at about 7 minutes contact time. Shorter contact times are preferred for appearance purposes.

As with every other step in the process sequence, following contact with the aqueous acid fluoride solution, the substrate is rinsed, preferably in deionized water, and subjected to the steps of electroless and electrolytic plating by methods known in the art.

The electroless plating catalysts employed may be noble metal or non-noble metal based. Non-noble metal catalysts are described in U.S. Pat. No. 3,958,048 to the same assignee as this application and incorporated herein by referencing.

A noble metal catalyst in an aqueous medium is presently preferred. By a "noble metal catalyst contained in an aqueous medium" there is meant an ionic solution or colloidal suspension of the free metals. Colloidal suspensions are preferred. The noble metals include gold, platinum and palladium, with palladium preferred.

A suitable ionic bath is one containing palladium chloride in a concentration of about 0.2 grams per liter of solution and 3 ml of concentrated hydrochloric acid per liter of solution. Following seeding, the palladium can be reduced to the free metal state by immersion in a bath of a reducing agent such as dimethyl amine borane.

Colloidal suspensions of noble metals are described in U.S. Pat. No. 3,011,920 to C. R. Shipley, Jr., incorporated herein by reference. Such suspensions are colloidal in nature in whic the noble metal colloid is maintained in suspension by a protective colloid, i.e., stannic acid colloids. Following seeding, the colloid is removed by immersion in an acidic or alkaline accelerator solution to remove the protective colloid and expose the absorbed noble metal.

Although less preferred, there may also be employed a seeding method which involves contacting the etched article with a sensitizing solution containing stannous chloride followed by immersion in an activator solution such as a palladium chloride solution where the ionic palladium is reduced to the free metal on the surface of the substrate.

Suitably activated, the article may be electrolessly plated by conventional means. Electroless copper and nickel formulations, such as those described in U.S. Pat. Nos. 3,011,920 and 3,874,072, incorporated herein by reference, may be employed. Excellent results have been obtained using electroless nickel solutions. Electroless copper solutions are typically based on a soluble copper salt, such as copper sulfate, a complexing agent for the cupric ion such as Rochelle salt, an alkali hydroxide for adjustment of pH, a carbonate radical as a buffer and a reducing agent for the cupric ion such as formaldehyde.

Following electroless plating, the substrate may be electrolytically plated by conventional means, with nickel, gold, silver, chromium and the like to provide the desired finish on the article. It has been observed that adhesion will increase with age of the plate.

In the following Examples and Controls, seeding of the treated substrate ws with a proprietary colloidal tinpalladium catalyst as described in U.S. Pat. No. 3,011,920 at an acid molarity of about 1.7. An alkaline accelerator was used to expose the palladium metal. The catalyst was maintained at about 115° F. and the accelerator at about 100° F. The electroless nickel solution employed was Cuposit ™ PM-980 manufactured and sold by the Shipley Company. Immersion was from 4 to 8 minutes and was maintained at 70° F. to 90° F.

Following electroless plating, the article as electrolytically plated. In this operation, the substrate was rinsed in deionized water, soaked in an alkaline cleaner, then passed to a reverse current cleaner, an acid dip, bright acid copper and nickel electrolytic plating solutions and finally to a chromium plating solution to a thickness of 2 mils.

Some plated articles were subjected to cycle testing to determine adhesion performance under thermal stress conditions. In this test the plated article was maintained at a temperature of at least 230° F. for 1 hour, then cooled to room temperature and maintained at room temperature for 30 minutes then cooled to −20° F. and maintained at that temperature for 1 hour.

CONTROLS A TO Y AND EXAMPLES 1 TO 23

Tests were conducted to compare the effect of the use of a sodium hydroxide solution alone to such solution in combination with an aqueous solution of ammonium bifluoride or an aqueous solution of ammonium bifluoride and sulfuric acid on the bond strength of an electroless plate to a polyester substrate. The aqueous solution of sodium hydroxide employed contained NaOH to a concentration of about 475 g/l. The aqueous solution of ammonium bifluoride contained $NH_4HF_2$ in a concentration of about 38.8 percent by weight. The aqueous solution of ammonium bifluoride promoted by sulfuric acid contained about 38.8 percent by weight $NH_4HF_2$ and about 9.5 percent by weight $H_2SO_4$. Ammonium sulfate was present in the acid-promoted solution at a concentration of about 8.5 percent by weight.

The procedure followed was to first immerse a substrate molded of Valox 744, a mineral-filled polyester manufactured and sold by General Electric Company, for 1 minute in a 0.05 to 0.1 percent by weight aqueous solution of a non-ionic detergent known as Intravon JU, manufactured and sold by Crompton and Knowles; then in a hydrolizer solution formed of 100 g/l $CrO_3$ and 400 mls/l $H_2SO_4$. This was a pretreatment to cleanse and render the surface hydrophilic and to eliminate surface bright spots. Contact times are specified in Tables I, II and III below. The cleansed substrate was then contacted with the sodium hydroxide conditioner alone (Table I) or with the conditioner, followed by contact with the ammonium bifluoride solution (Table II) or the ammonium bifluoride-sulfuric acid etch solution (Table III). the substrate was then catalyzed; electrolessly plated with nickel; then electrolytically plated to a thickness of 2 mils. The results of adhesion and cycle tests are shown in the Tables, wherein the following legends were employed:

Appearance of Plate

E = Excellent
G = Good
VG = Very Good
GR = Granular
SGr = Slightly Granular
VSGr = Very Slightly Granular Cycle Test P = All passed
F(a/b) = a of b tested failed

TABLE I

| | Controls A to Y NaOH Conditioning | | | | | | | | | | |
|---|---|---|---|---|---|---|---|---|---|---|---|
| Control | A | B | C | D | E | F | G | H | I | J | K |
| Hydrolizer Contact Time, min. | 3 | 3 | 4 | 5 | 6 | 6 | 7 | 8 | 2 | 7 | 8 |

TABLE I-continued

Controls A to Y
NaOH Conditioning

| | | | | | | | | | | | |
|---|---|---|---|---|---|---|---|---|---|---|---|
| NaOH Solution Contact Time, min. | 8 | 8 | 8 | 8 | 9 | 8 | 8 | 8 | 8 | 7 | 7 |
| Temp., °F. | 152 | 150 | 148 | 148 | 148 | 150 | 150 | 150 | 150 | 148 | 150 |
| Adhesion, lb./in. | | | | | | | | | | | |
| Range, Lo/Hi | 3.8/6.3 | 2.8/3.9 | 2.7/4.8 | 3.0/4.8 | 3.0/5.0 | 2.9/5.3 | 3.0/4.6 | 2.8/4.0 | 2.5/4.2 | 3.0/4.2 | — |
| Average | 4.8 | 3.5 | 3.9 | 4.1 | 3.9 | 4.0 | 3.8 | 3.5 | 3.1 | 3.7 | 3.5 |
| Appearance | E | E | E | G | E | E | E | E | E | E | E |
| Cycle Test | P | P | P | P | P | P | F(⅓) | F(3/3) | F(⅓) | F(⅔) | F(⅓) |

| Control | L | M | N | O | P | Q | R | S | T | U | V | W | X | Y |
|---|---|---|---|---|---|---|---|---|---|---|---|---|---|---|
| Hydrolizer Contact Time, min. | 2 | 3 | 4 | 5 | 6 | 7 | 8 | 2 | 2 | 3 | 4 | 5 | 6 | 7 |
| NaOH Solution Contact Time, min. | 6 | 6 | 6 | 6 | 6 | 6 | 6 | 10.5 | 9 | 9 | 9 | 9.5 | 9 | 9 |
| Temp., °F. | 152 | 150 | 150 | 150 | 150 | 150 | 150 | 150 | 150 | 151 | 149 | 151 | 148 | 148 |
| Adhesion, lb./in. | | | | | | | | | | | | | | |
| Range, Lo/Hi | 3.0/4.0 | 3.0/4.0 | 3.0/4.0 | 3.0/4.5 | 3.5/4.9 | 2.9/4.8 | 2.7/3.4 | 1.6/4.1 | 2.5/2.7 | 3.0/4.3 | 2.6/4.0 | 1.9/3.4 | 1.9/3.7 | 1.0/3.6 |
| Average | 3.5 | 3.5 | 3.5 | 3.4 | 4.1 | 3.3 | 2.9 | 2.0 | 2.8 | 3.5 | 3.6 | 3.0 | 2.7 | 3.0 |
| Appearance | E | E | E | E | E | E | E | E | E | E | E | VG | VG | E |
| Cycle Test | F(⅓) | — | — | P | P | P | P | P | P | P | P | P | P | P |

TABLE II

Examples 1 to 8
NaOH Conditioning plus $NH_4HF_2$ Solution

| Example | 1 | 2 | 3 | 4 | 5 | 6 | 7 | 8 |
|---|---|---|---|---|---|---|---|---|
| Hydrolizer Contact Time, min. | 3 | 3 | 3 | 3 | 3 | 3 | 3 | 3 |
| NaOH Conditioner | | | | | | | | |
| Contact Time, min. | 1 | 2 | 3 | 4 | 5 | 6 | 7 | 8 |
| Temp., °F. | 149 | 150 | 149 | 148 | 154 | 154 | 154 | 154 |
| $NH_4HF_2$ Solution | | | | | | | | |
| Contact Time, min. | 10 | 10 | 10 | 10 | 10 | 10 | 10 | 8.3 |
| Temp., °F. | 153 | 153 | 152 | 152 | 154 | 154 | 154 | 155 |
| Adhesion, lb./in. | | | | | | | | |
| Range, Lo/Hi | 3.9/6.0 | 4.8/6.5 | 4.5/7.3 | 4.3/5.5 | 4.6/7.5 | 4.3/7.2 | 4.2/7.6 | 3.8/7.6 |
| Average | 4.8 | 5.6 | 5.6 | 5.0 | 5.6 | 5.6 | 6.1 | 5.7 |
| Appearance | E | E | E | E | SGr | SGr | SGr | SGr |
| Cycle Test | P | F(⅔) | P | P | P | P | P | P |

TABLE III

Examples 9 to 23
NaOH Conditioning plus $NH_4HF_2$—$H_2SO_4$ Solution

| Example | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|
| Hydrolizer Contact Time, min. | 3 | 3 | 3 | 3 | 3 | 3 | 3 | 3 | 3 | 3 | 3 | 3 | 3 | 3 | 3 |
| NaOH Conditioner | | | | | | | | | | | | | | | |
| Contact Time, min. | 3 | 3 | 3 | 3 | 3 | 3 | 3 | 3 | 3 | 3 | 3 | 3 | 3.3 | 3 | 3 |
| Temp., °F. | 156 | 155 | 156 | 156 | 152 | 150 | 156 | 155 | 153 | 153 | 153 | 153 | 155 | 154 | 152 |
| $NH_4HF_2$—$H_2SO_4$ Solution | | | | | | | | | | | | | | | |
| Contact Time, min. | 1 | 2 | 3 | 10 | 4 | 5 | 6 | 7 | 8 | 9 | 32 | 20 | 1 | 2 | 1 |
| Temp., °F. | 133 | 131 | 129 | 128 | 132 | 132 | 130 | 130 | 130 | 130 | 130 | 128 | 95 | 95 | |
| Adhesion, lb./in. | | | | | | | | | | | | | | | |
| Range, Hi/Lo | 3.9/5.4 | 4.6/6.4 | 4.1/7.2 | 6.2/9.4 | 4.7/7.2 | 4.7/6.7 | 4.2/7.2 | 6.3/8.5 | 6.1/9.1 | 3.7/8.2 | 5.6/9.0 | 3.5/4.5 | 3.5/4.5 | 3.3/4.3 | |
| Average | 4.9 | 5.5 | 5.9 | 8.0 | 5.9 | 6.4 | 5.4 | 7.5 | 7.6 | 6.7 | 7.5 | 4.0 | 4.0 | 3.8 | |
| Appearance | E | E | E | VSGr | VSGr | VSGr | VSGr | VSGr | VSGr | VSGr | Gr | E | E | E | E |

TABLE III-continued

Examples 9 to 23
NaOH Conditioning plus NH$_4$HF$_2$—H$_2$SO$_4$ Solution

| Example | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|
| Cycle Test | P | P | P | P | P | P | P | P | P | F(⅓) | F(3/3) | P | P | P | P |

CONTROL Z

The procedure for Examples 9 to 23 was followed, except that contact with the NaOH conditioner was omitted. Contact with the NH$_4$HF$_2$—H$_2$SO$_4$ solution was for 5 minutes at a solution temperature of 128° F. Adhesion ranged from 2.2 to 3.0 lbs./in., averaging 2.8 lbs./in. Appearance was excellent and failure of all test substrates occurred in the cycle test.

EXAMPLES 24 TO 29

Following the procedure of Examples 1 to 23, tests were made where variant was ammonium bifluoride concentration and immersion time and to exemplify the effect of sulfuric acid to promote acid etch. Solution temperature was about 130° F. and followed contact with an NaOH solution (325 g/l) at 150° F. The results are shown in Table IV.

TABLE IV

| | | Adhesion, Average lb./in. | | |
|---|---|---|---|---|
| Example | Solution | 3 min. | 6 min. | 10 min. |
| 24 | 28% by weight NH$_4$HF$_2$ | 2.6 | 2.7 | 4.2 |
| 25 | 33% by weight NH$_4$HF$_2$ | 3.1 | 3.8 | 4.7 |
| 26 | 37% by weight NH$_4$HF$_2$ | 2.3 | 3.4 | 4.9 |
| 27 | 41% by weight NH$_4$HF$_2$ | 2.8 | 2.4 | 4.0 |
| 28 | 45% by weight NH$_4$HF$_2$ | 1.6 | 2.2 | 4.1 |
| 29 | 40% by weight NH$_4$HF$_2$ +9.3% by weight H$_2$SO$_4$ | 6.7 | 7.9 | 9.0 |

The substrates tested had very good to excellent plate appearance and all passed the cycle test. While results were essentially independent of NH$_4$HF$_2$ concentration, the addition of sulfuric acid had the effect of doubling adhesion, other factors being constant.

What is claimed is:

1. A process for preparing the surface of filled polyester substrates for electroless plating which comprises:
   (a) forming a conditioned filled polyester substrate by contacting the filled polyester substrate with an alkaline conditioner having a pH of at least about 8 and maintained at a temperature from about 135° F. to the lesser of the boiling point of the solution and the softening temperature of the filled polyester substrate for a time sufficient to render the substrate receptive to etch by an acid fluoride etch solution; and
   (b) etching the conditioned filled polyester substrate by contact with an aqueous acid fluoride etch solution having a pH less than about 5 and containing fluoride in concentration of from about 1 mole per liter of solution to solution saturation as provided by at least one soluble fluoride compound for a time sufficient to etch the surface of the filled polyester substrate and increase adhesion of an electrolessly deposited metal thereto.

2. A process as claimed in claim 1 in which the alkaline conditioner is an aqueous alkaline conditioning solution containing at least one alkali metal hydroxide in a concentration of from about 2 percent by weight to solution saturation.

3. A process as claimed in claim 2 in which the alkali metal hydroxide content of the alkaline conditioning solution is from about 25 to about 35 percent by weight of solution.

4. A process as claimed in claim 1 in which the alkaline conditioner is maintained at a temperature of from about 145° F. to about 175° F.

5. A process as claimed in claim 1 in which the filled polyester substrate is contacted with the alkaline conditioner for a time of from about 0.5 minute to about 20 minutes.

6. A process as claimed in claim 1 in which the filled polyester substrate is contacted with the alkaline conditioner for a time of from about 3 to about 8 minutes.

7. A process as claimed in claim 1 in which the aqueous acid fluoride etch solution is at a temperature of from about 125° F. to about 150° F.

8. A process as claimed in claim 1 in which the conditioned filled polyester substrate is contacted with the aqueous acid fluoride etch solution for a period of from about 1 to about 20 minutes.

9. A process as claimed in claim 1 in which the conditioned polyester substrate is contacted with the aqueous acid fluoride etch solution for a period of from about 3 to about 8 minutes.

10. A process as claimed in claim 1 in which the aqueous acid fluoride etch solution comprises from about 20 to about 40 percent by weight ammonium bifluoride.

11. A process as claimed in claim 1 in which the aqueous acid fluoride etch solution comprises from about 25 to about 35 percent by weight ammonium bifluoride.

12. A process as claimed in claim 10 in which the aqueous acid fluoride etch solution comprises an acid selected from the group consisting of a mineral acid, hydrofluoric acid and mixtures thereof.

13. A process as claimed in claim 11 in which the aqueous acid fluoride etch solution comprises from about 5 to about 15 percent by weight sulfuric acid.

14. A process as claimed in claim 1 in which the filled polyester substrate comprises polybutylene terephthalate.

15. A process for preparing a surface of filled polyester substrates for electroless plating which comprises:
   (a) forming a conditioned filled polyester substrate by contacting the filled polyester substrate with an aqueous alkaline conditioning solution containing at least one alkali metal hydroxide in which the total alkali metal hydroxide concentration is from 2 percent by weight of the solution to solution saturation and maintained at a temperature from about 135° F. to the lesser of the boiling point of the solution and the softening temperature of the filled polyester substrate for a period of time of from about 0.5 to about 20 minutes; and (b) forming an etched filled polyester substrate by contacting the conditioned filled polyester substrate with an aqueous acid fluoride etch solution comprising from about 3 percent by weight of solution to solution saturation of ammonium bifluoride for a time sufficient to etch the surface of the filled polyester substrate and increase adhesion of an electroless deposited metal thereto.

16. A process as claimed in claim 15 in which the alkali metal hydroxide content of the aqueous alkaline conditioning solution is from about 10 to about 50 percent by weight of solution.

17. A process as claimed in claim 15 in which the alkali metal hydroxide content of the aqueous alkaline conditioning solution is from about 25 to about 35 percent by weight of solution.

18. A process as claimed in claim 15 in which the aqueous alkaline conditioning solution is maintained at a temperature of from about 140° F. to about 175° F.

19. A process as claimed in claim 15 in which the filled polyester substrate is contacted with the aqueous alkaline conditioning solution for a time of from about 3 to about 8 minutes.

20. A process as claimed in claim 15 in which the aqueous acid fluoride etch solution is at a temperature of from 125° F. to 150° F.

21. A process as claimed in claim 15 in which the conditioned polyester substrate is contacted with the aqueous acid fluoride etch solution for a period of from about 1 to about 20 minutes.

22. A process as claimed in claim 15 in which the conditioned polyester substrate is contacted with the aqueous acid fluoride etch solution for a period of from about 3 to about 8 minutes.

23. A process as claimed in claim 15 in which the aqueous acid fluoride solution comprises from about 20 to about 40 percent by weight ammonium bifluoride.

24. A process as claimed in claim 15 in which the aqueous acid fluoride etch solution comprises from about 25 to about 35 percent by weight ammonium bifluoride.

25. A process as claimed in claim 23 in which the aqueous acid fluoride etch solution comprises an acid selected from the group consisting of a mineral acid, hydrofluoric acid and mixtures thereof.

26. A process as claimed in claim 23 in which the aqueous acid fluoride etch solution comprises from about 5 to about 15 percent by weight sulfuric acid.

27. A process as claimed in claim 15 in which the filled polyester substrate comprises polybutylene terephthalate.

28. A process for preparing the surface of polyester substrates for electroless plating which comprises:
(a) forming a conditioned filled polyester substrate by contacting the filled polyester substrate with an aqueous alkaline conditioning solution of at least one alkali metal hydroxide in which the total alkali metal hydroxide concentration is from about 10 to about 50 percent by weight of the solution to solution saturation and maintained at a temperature of from about 135° F. to the lesser of the boiling point of the solution and the softening temperature of the polyester surface for a period of time of from 0.5 to about 20 minutes; and
(b) forming an etched polyester substrate by contacting the conditioned polyester substrate with an aqueous acid fluoride etch solution comprising from about 20 to about 40 percent by weight ammonium bifluoride in combination with an acid selected from the group consisting of hydrofluoric acid and a mineral acid for a period of time of from about 1 to about 20 minutes.

29. A process as claimed in claim 28 in which the alkali metal hydroxide content of the alkaline conditioning solution is from about 25 to about 35 percent by weight of solution.

30. A process as claimed in claim 28 in which the filled polyester substrate is contacted with the alkaline conditioning solution for a time of from about 3 to about 8 minutes.

31. A process as claimed in claim 28 in which the aqueous acid fluoride etch solution is at a temperature of from about 125° F. to about 150° F.

32. A process as claimed in claim 28 in which the conditioned polyester substrate is contacted with the aqueous acid fluoride etch solution for a period of from about 3 to about 8 minutes.

33. A process as claimed in claim 28 in which the alkaline conditioning solution is maintained at a temperature of from about 145° F. to about 175° F.

34. A process as claimed in claim 28 in which the acid is sulfuric acid.

35. A process as claimed in claim 28 in which the filled polyester substrate comprises polybutylene terephthalate.

36. A process for preparing the surface of polyester substrates for electroless plating which comprises:
(a) forming a conditioned filled polyester substrate by contacting the filled polyester substrate with an aqueous alkaline conditioning solution of at least one alkali metal hydroxide in which the total alkali metal hydroxide concentration is from about 10 percent by weight of the solution to solution saturation and maintained at a temperature of from about 135° F. to the lesser of the boiling point of the solution and the softening temperature of the polyester surface for a period of time of from 3 to about 8 minutes; and
(b) forming an etched polyester substrate by contacting the conditioned polyester substrate with an aqueous acid fluoride etch solution comprising from 20 to about 40 percent by weight ammonium bifluoride and from about 5 to about 15 percent by weight sulfuric acid for a period of time of from 1 to about 20 minutes.

37. A process as claimed in claim 36 in which the alkali metal hydroxide content of the alkaline conditioning solution is from about 25 to about 35 percent by weight of solution.

38. A process as claimed in claim 36 in which the alkaline conditioning solution is maintained at a temperature of from about 145° F. to about 175° F.

39. A process as claimed in claim 36 in which the filled polyester substrate is contacted with the alkaline conditioning solution for a time of from about 3 to about 8 minutes.

40. A process as claimed in claim 36 in which the aqueous acid fluoride etch solution is at a temperature of from about 125° F. to about 150° F.

41. A process as claimed in claim 36 in which the aqueous acid fluoride etch solution is at a temperature of from about 125° F. to about 150° F.

42. A process as claimed in claim 36 in which the conditioned filled polyester substrate is contacted with the aqueous acid fluoride etch solution for a period of from about 3 to about 8 minutes.

43. A process as claimed in claim 41 in which the conditioned filled polyester substrate is contacted with the aqueous acid fluoride etch solution for a period of from about 3 to about 8 minutes.

44. A process as claimed in claim 37 in which the sulfuric acid concentration of the aqueous acid fluoride etch solution is from about 8 to about 10 percent by weight and contact time with the aqueous acid fluoride etch solution is from about 3 to about 8 minutes.

45. A process as claimed in claim 41 in which the sulfuric acid concentration of the aqueous acid fluoride etch solution is from about 8 to about 10 percent by weight and contact time with the aqueous acid fluoride etch solution is from about 3 to about 8 minutes.

46. A process as claimed in claim 37 in which the aqueous acid fluoride etch solution comprises from about 8 to about 10 percent by weight sulfuric acid.

47. A process as claimed in claim 45 in which the aqueous acid fluoride etch solution comprises from about 8 to about 10 percent by weight sulfuric acid.

48. A process as claimed in claim 36 in which the filled polyester substrate comprises polybutylene terephthalate.

* * * * *